(12) United States Patent
Roovers et al.

(10) Patent No.: US 6,731,231 B2
(45) Date of Patent: May 4, 2004

(54) ANALOGUE TO DIGITAL CONVERTER

(75) Inventors: Raf Lodewijk Jan Roovers, Eindhoven (NL); Hendrik Van Der Ploeg, Eindhoven (NL); Gian Hoogzaad, Delft (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/261,843

(22) Filed: Sep. 30, 2002

(65) Prior Publication Data

US 2003/0076253 A1 Apr. 24, 2003

(30) Foreign Application Priority Data

Oct. 3, 2001 (EP) ............................................ 01203734

(51) Int. Cl.[7] ................................................ H03M 1/12
(52) U.S. Cl. ...................... 341/156; 341/155; 341/120; 341/118; 341/137
(58) Field of Search ................................ 341/156, 155, 341/120, 118, 137

(56) References Cited

U.S. PATENT DOCUMENTS

| | | | | |
|---|---|---|---|---|
| 5,353,027 A | * | 10/1994 | Vorenkamp et al. | ........ 341/156 |
| 5,926,123 A | * | 7/1999 | Ostrom et al. | ............... 341/155 |
| 5,990,515 A | * | 11/1999 | Liu et al. | ..................... 257/316 |
| 6,445,329 B1 | * | 9/2002 | Abassi et al. | ............... 341/156 |
| 6,452,529 B1 | * | 9/2002 | Li | ............................... 341/156 |
| 6,459,400 B1 | * | 10/2002 | Steinbach | ................... 341/156 |
| 6,459,913 B2 | * | 10/2002 | Cloutier | ...................... 455/567 |
| 6,480,133 B2 | * | 11/2002 | Kobayashi et al. | ......... 341/156 |
| 6,498,577 B1 | * | 12/2002 | Lin | .............................. 341/156 |
| 6,535,152 B2 | * | 3/2003 | Lee | ............................. 341/156 |
| 6,535,156 B1 | * | 3/2003 | Wang et al. | ................ 341/156 |
| 6,590,518 B1 | * | 7/2003 | Taft | ............................ 341/156 |

* cited by examiner

*Primary Examiner*—Michael Tokar
*Assistant Examiner*—Lam Mai
(74) *Attorney, Agent, or Firm*—Michael J. Ure

(57) ABSTRACT

A pipeline/subranging architecture is used to provide a circuit for analog to a digital conversion. A course analog to digital converter, a fine analog to digital to converter, combining logic circuitry and a digital to analog converter are used, together with a voltage to current converter and a current to voltage converter. A residual signal is formed as the difference between the input signal and an output signal of the coarse analog to digital conversion, the latter output signal having been converted to analog form by the analog to digital converter. The residual signal is then scaled appropriately and applied to the fine analog to digital converter. A final output signal is based on the output signals of the coarse digital to analog converter and the fine digital to analog converter.

12 Claims, 3 Drawing Sheets

ANALOGUE TO DIGITAL CONVERTER

The present invention relates to an analogue to digital converter.

High speed and high resolution are highly desirable features when designing analogue to digital converters (ADCs). The latest ADCs are the 12 bit 65 MS/s level converters, one example of which is Philips model TDA 8767/8. It is desirable to achieve 14 bit or higher accuracy.

One known approach to achieving high speed and high resolution is to use calibration, i.e. to store non-linearity information and digitally correct the ADC on-line. This requires large amounts of digital and memory circuitry and also the ADC must be off-line while the calibration signal is generated and this is undesirable.

Another approach is to use a ladder resistor combined with offset compensated amplifiers in a two or three step 14 bit ADC. Problems arise in realizing ladder resistors accurately and the noise levels tend to be higher than desirable.

Yet a further approach is to use the static linearity of a current DAC (digital to analogue converter). For example, a known such implementation comprises:
- a sample and hold circuit;
- a coarse analogue to digital converter (ADC);
- a digital to analogue converter (DAC);
- combining logic circuitry; and
- a fine analogue to digital converter (ADC).

This is a known as basic pipeline/subranging architecture. However, major problems arise in matching the DAC with the inter-stage gain and with the range of fine ADCs and offsets and the speed and resolution of known implementations have been limited.

The present invention aims to provide an ADC with high speed and high resolution without the disadvantages of the known implementations described above.

According to the present invention there is provided a circuit for analogue to digital conversion comprising;
- a sample and hold circuit;
- a coarse analogue to digital converter;
- a digital to analogue converter;
- combining logic circuitry;
- a fine analogue to digital converter; characterized by
- a voltage to current converter (R1);
- means for subtracting in the current domain;
- means for summing at a virtual earth node; and
- means for converting current to voltage at the input to the fine analogue to digital converter.

According to a preferred embodiment the subtracting means comprises a current digital to analogue converter and preferably a matched unit current cell.

Preferably the fine analogue to digital converter additionally comprises a resistor matched to the means for converting current to voltage, and a current source matched to the current of the digital to analogue converter current cells.

According to a further aspect of the invention there is provided a plurality of pairs of voltage to current and current to voltage converters connected in cascade formation. Hence the ladder of the second ADC will only approximately determine the range and the second ADC and will drive another series of matched current sources.

According to a preferred embodiment of the further aspect of the invention, a plurality of sample and hold circuits are provided. This has the advantage of increasing the sample rate of the circuit.

An implementation according to the invention, enables a reduction in the number of components to be matched is reduced and the level of matching is reduced to the subrange accuracy.

For a better understanding of the present invention and to show how the same may be carried into effect, reference will now be made to the accompanying drawings, in which.

Figure 1:
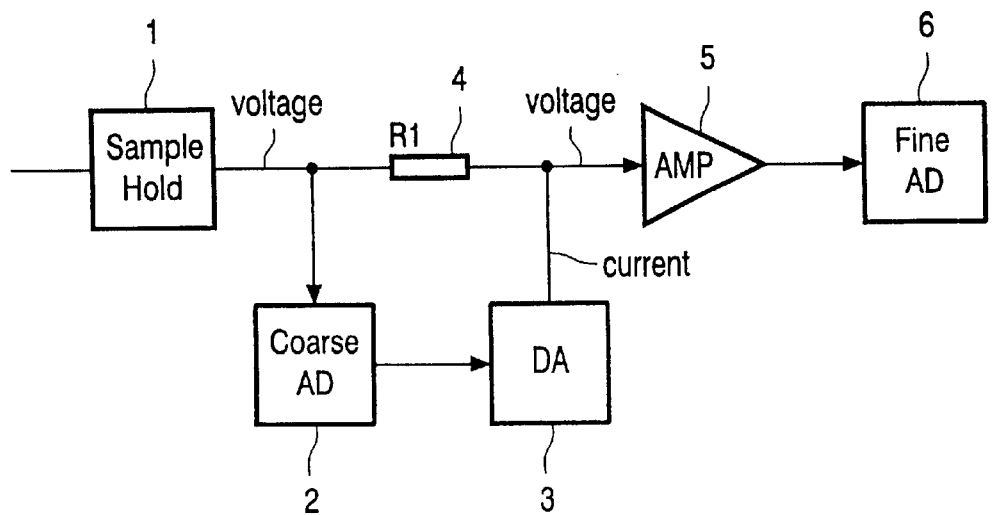
FIG. 1 is a circuit diagram of a known prior art circuit.

In FIG. 1 a basic known pipeline/subranging architecture circuit is shown, such as is described in U.S. Pat. No. 5,283,581. This is essentially an analogue voltage subtraction circuit and comprises a sample and hold circuit 1 with a voltage output connected to a course A/D converter 2, for providing higher order bits and to a load resistor 4 (R1). The output of the course A/D converter 2 is connected to a D/A converter 3. The load resistor 4 and the D/A converter 3 effectively act as a subtracting circuit to calculate the difference between the analogue voltage output from the sample and hold circuit 1 and the voltage value corresponding to the higher order bits as calculated by the A/D converter 2. The difference in these signals is amplified in an amplifier 5 before the signal is passed to a fine A/D converter 6 for providing the lower order bits.

Figure 2:
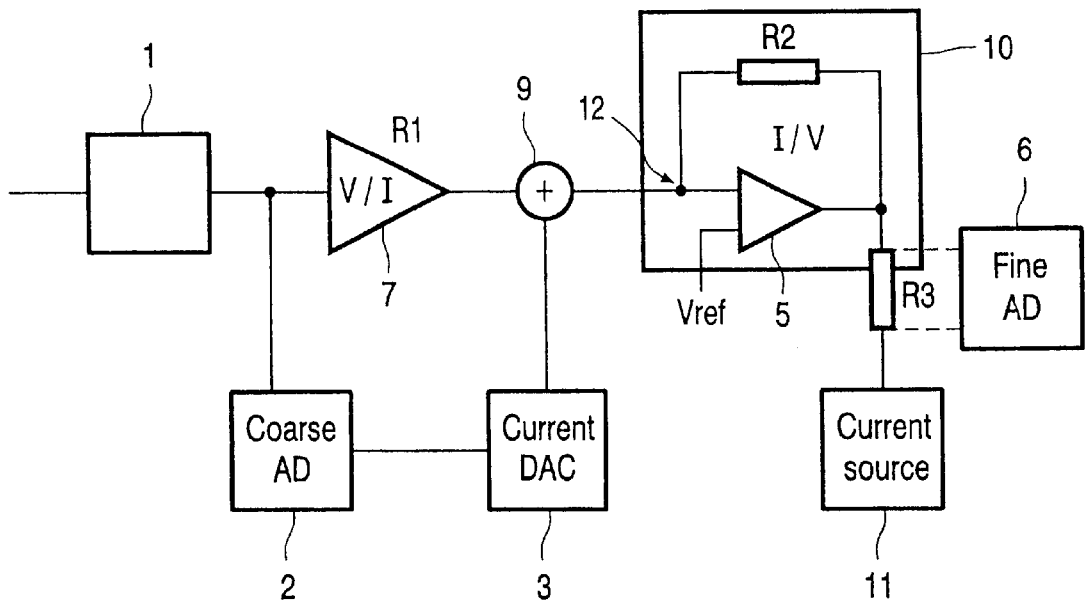
FIG. 2 is a circuit diagram of one embodiment of the present invention.

One embodiment of the new circuit according to the invention is shown in FIG. 2. A sample and hold circuit 1 supplies a voltage input signal both to a voltage to current (V/I) converter 7 and also to a course A/D converter 2. The V/I converter 7 comprises a load resistor R1. The resulting current signals are then subtracted at node 9. It is advantageous to operate the I/V conversion with a virtual earth input node so as to reduce the voltage swing on the summing node. The residual current resulting from the subtraction is converted back into a voltage using I/V converter 10 comprising load R2, and the voltage signal is fed to the fine A/D converter 6 as shown. The I/V converter 10 comprises a resistor R2 and an operational amplifier 5. The gain of the amplifier 5 should be large enough to minimize the gain error of the I/V converter 10.

For good performance of a converter, i.e. good linearity, the range of the fine A/D converter 6 must match the residual signal and this is determined by a combination of factors including the D/A converter step size and the gain of the amplifier. In the circuit according to the invention the matching of the fine A/D range can be relatively easily achieved using a load resistor R3 in the fine A/D converter 6 matched to the load R2 of the IV converter 10, and a current source 11 matched to the current D/A converter 3. The resistors do not require full A/D linearity matching, and because the ratio of R2 and R3 is small, matching can be achieved more easily than prior art implementations such as that shown in FIG. 1. In addition the number of components to be matched is actually reduced.

Figure 5:
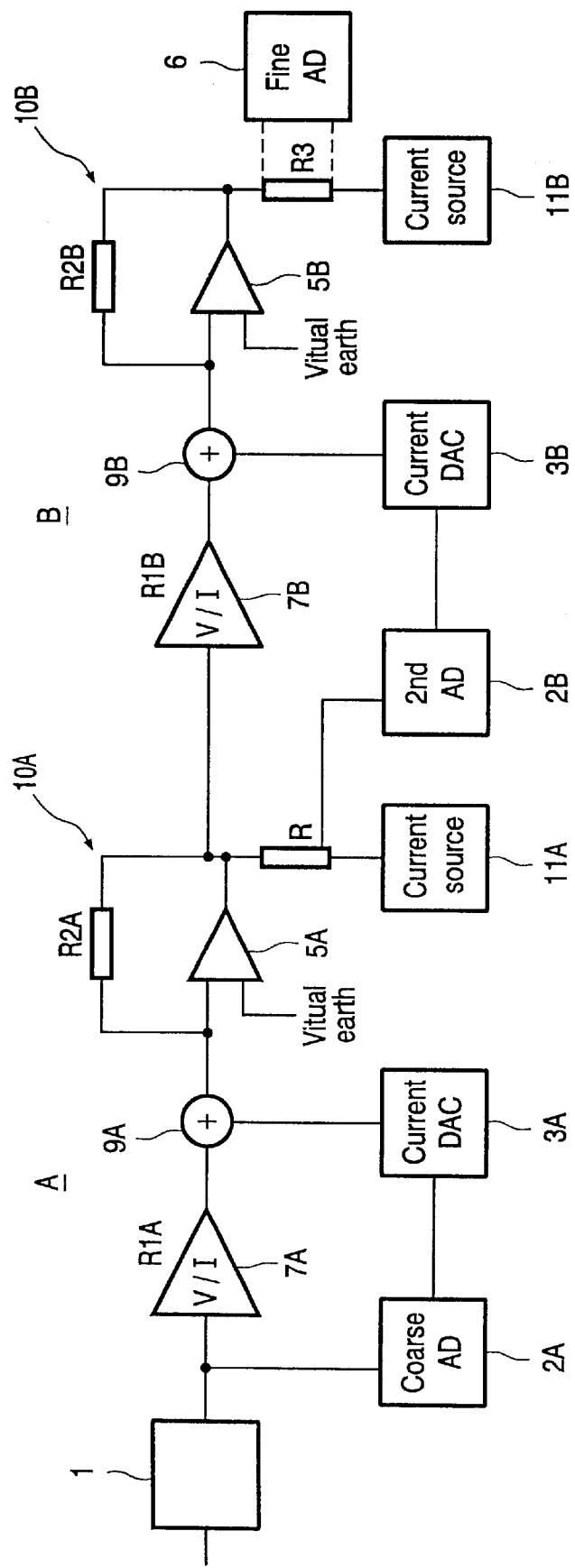
FIG. 5 is a circuit diagram of another part of the circuit of FIGS. 2 and 3; i.e. of the current DAC of the circuit of FIGS. 2 and 3.

In a further embodiment, which is shown in FIG. 5, the V/I and I/V sections can be cascaded, with the ladder of a second A/D converter only approximately determining the range and driving another series of matched current sources. More sample and hold functions can be inserted in the signal chain to increase sample rate. The sample and hold circuit 1 supplies an input voltage Vin to a first section A which comprises two branches, one comprising a coarse A/D converter 2A and a current D/A converter 3A, and the other branch comprising a V/I converter 7A with a load R1A. The currents from the two branches are subtracted at node 9A and the result is applied to I/V converter 10A comprising an amplifier 5A and a load R2A. The voltage output of the I/V converter 10A is supplied to a V/I converter 7B with load R1B of a second section B, and via load resistor R connected across the amplifier output and a current source 11A, to a second stage coarse A/D converter 2B. The second stage coarse A/D converter 2B is connected to a second stage current D/A converter 3B and the currents are subtracted in the second stage at node 9B. The resulting signal is provided at an input of second stage I/V converter 11B comprising amplifier 5B and load R2B. The voltage output of converter 11B is then supplied to the fine A/D converter 6 which has a load R5B and a current source 11B.

In this cascaded version matching must be made with the resistors R2A, R3A, R2B and R3B. In addition the current source 11B must match the current D/A converter 3A of the first stage and the current D/A converter 3B of the second stage.

Preferably the fine A/D ladder should not be loaded with base currents. It is preferable to use MOST type transistors or alternatively a second ladder could be implemented.

Such an arrangement provides a compact A/D converter having a high speed and high resolution. The use of a virtual earth 12 at the summing node 9 reduces the requirements for D/A conversion and provides increased voltage headroom for the V/I converter and the D/A converter to operate.

Figure 3:
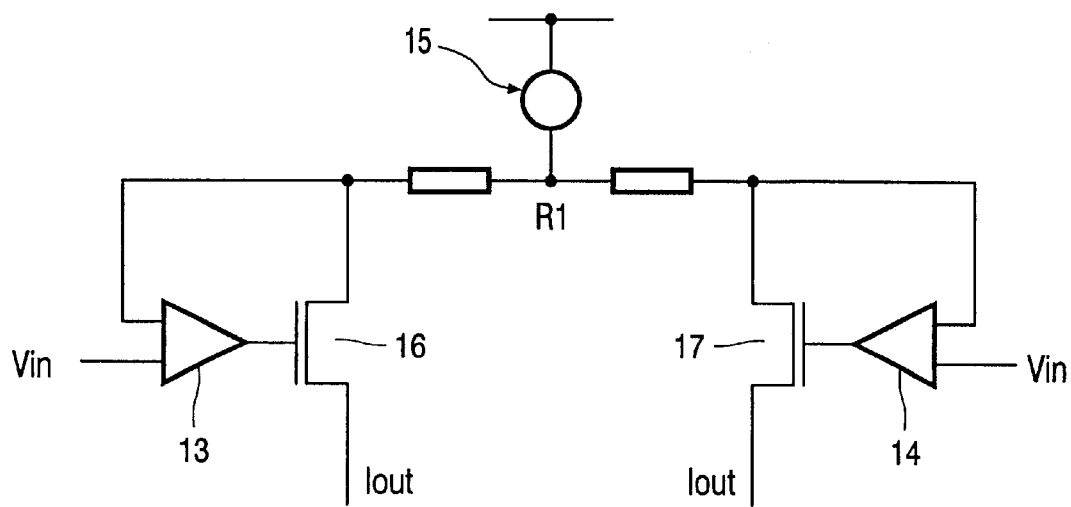
FIG. 3 is a circuit diagram of another embodiment of the circuit of FIGS. 2 and 3; i.e. of the pipelined implementation.

FIG. 3 illustrates a possible implementation for a voltage to current (V/I) converter such as the converter 7 in FIG. 2 or the converters 7A and 7B in FIG. 3. An input voltage is applied to two amplifiers 13 and 14, the other inputs of which are connected together across a load R1 supplied by current source 15. The outputs of the amplifiers 13 and 14 are applied to the bases of field effect transistors (FET) 16 and 17 respectively, each of which in turn supplies an output current Iout. This form of implementation is based on a linear resistor (e.g. poly) driven by a feedback amplifier. The gain of the amplifier is determined by the required linearity and its bandwidth by the settling time and settling error. The amplifiers in the first stage contribute most to noise. MOSTs are preferably used to avoid base current loss and the output conductance of the FETs 16 and 17 is supplied to a virtual earth.

Figure 4:
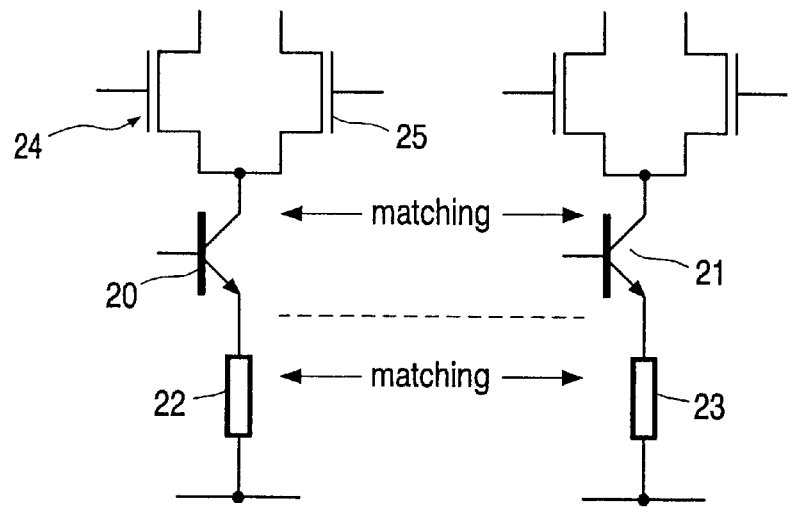
FIG. 4 is a circuit diagram of a part, i.e. of the V/I converter of the circuit of FIGS. 2 and 3.

FIG. 4 illustrates a possible implementation for a Digital to Analogue (D/A) converter, such as is illustrated at 3 in FIGS. 1 and 2, and at 3A and 3B in FIG. 5. This comprises source coupled FETs 24 and 25, which supply a transistor 20 and a load 22. This provides a highly accurate current source and is based either on matching the transistors 20 and 21 and the resistor loads 22 and 23 in each stage or alternatively on calibration or dynamic element matching.

What is claimed is:

1. A circuit for analogue to digital conversion comprising:
a sample and hold circuit (1) connected to
a coarse analogue to digital converter (2) which is connected to
a digital to analogue converter (3) which is connected to combining logic circuitry and;
a fine analogue to digital converter (6);
wherein the circuit is characterised by
a voltage to current converter (7; R1) connected to the output of the
sample and hold circuit (1);
and to means for subtracting in the current domain having its inputs
connected to the—current converter and to the digital to analogue converter;
means for summing at a virtual earth node (9); and
means for converting the output current of the substracting means
to a current to voltage (10; R2) at the input to the fine analogue to digital converter (6).

2. A circuit according to claim 1 wherein the means for subtracting comprises a current digital to analogue converter (3).

3. A circuit according to claim 2 wherein the current digital to analogue converter (3) comprises a matched unit current cell.

4. A circuit according to claim 1 wherein the fine analogue to digital converter (6) further comprises a resistor (R3) matched to the means for converting current to voltage (R2).

5. A circuit according to claim 4 wherein the fine analogue to digital converter (6) further comprises a current source matched to the current to the digital to analogue converter (3).

6. A circuit according to claim 1 comprising a plurality of pairs of voltage to current (7A; 7B) and current to voltage (10A; 10B) converters connected in cascade formation, arranged such that the ladder of the second analogue to digital converter drives a further series of matched current sources.

7. A circuit according to claim 1 further comprising a plurality of sample and hold circuits (1) are provided.

8. A circuit according to claim 1 wherein the current to voltage converter (10) comprises a virtual earth input node (12).

9. A circuit according to claim 1 wherein the current to voltage converter (R2) comprises a resistor and an operational amplifier (5).

10. A circuit according to claim 1 comprising a cascade arrangement of the voltage to current and the current to voltage sections with matched resistors and the current sources (11A; 11B) matched to the current digital too analogue converters (3A) to the first (3B) and second stages.

11. A circuit according to claim 1 comprising MOST type transistors.

12. A circuit according to claim 1 wherein at least one of the digital to analogue converters (3) comprises a pair of source coupled FETs (24, 25) a transistor (20) and a load (22).

* * * * *